United States Patent [19]

Herberg

[11] Patent Number: 4,502,072
[45] Date of Patent: Feb. 26, 1985

[54] FET CONTROLLED THYRISTOR

[75] Inventor: Helmut Herberg, Munich, Fed. Rep. of Germany

[73] Assignee: Siemens Aktiengesellschaft, Berlin & Munich, Fed. Rep. of Germany

[21] Appl. No.: 345,925

[22] Filed: Feb. 4, 1982

[30] Foreign Application Priority Data

Mar. 31, 1981 [DE] Fed. Rep. of Germany ....... 3112941

[51] Int. Cl.³ .................... H01L 29/74; H01L 29/78; H01L 27/02; H01L 29/167
[52] U.S. Cl. ................................. 357/38; 357/23.4; 357/43; 357/64; 357/86
[58] Field of Search ............. 357/38, 20, 43, 86, 357/23.4, 64

[56] References Cited

U.S. PATENT DOCUMENTS

| 3,300,694 | 1/1967 | Stehney et al. | 357/38 |
| 3,486,088 | 12/1969 | Gray et al. | 357/38 |
| 3,526,815 | 9/1970 | Svedberg et al. | 357/38 |
| 3,641,404 | 2/1972 | Svedberg | 357/38 |
| 4,060,825 | 11/1977 | Schlegel | 357/20 |
| 4,165,517 | 8/1979 | Temple et al. | 357/38 |
| 4,224,634 | 9/1980 | Svedberg | 357/38 |

FOREIGN PATENT DOCUMENTS

| 0008008 | 2/1980 | Fed. Rep. of Germany | 357/38 T |
| 2945347 | 5/1981 | Fed. Rep. of Germany | |
| 52-35586 | 3/1977 | Japan | 357/38 T |
| 55-113371 | 9/1980 | Japan | 357/20 |

OTHER PUBLICATIONS

Hoffman, A. et al, "Thyristor Handbuch", 1965, Siemens-Schuckertwerke AG, pp. 27–28.

Primary Examiner—Andrew J. James
Assistant Examiner—John LaMont
Attorney, Agent, or Firm—Hill, Van Santen, Steadman & Simpson

[57] ABSTRACT

A thyristor has an n-emitter provided with a cathode, a p-emitter provided with an anode, and two base layers respectively adjacent thereto. Further, an auxiliary emitter serves the purpose of internal current gain. High ignition sensitivity is strived for in addition to good stability. To this end, a connectible auxiliary emitter is provided next to the auxiliary emitter, forming a three-layer structure together with the base layers with a higher current transfer ratio for the charge carriers emitted by it than the auxiliary emitter. In order to produce a high ignition sensitivity, the connectible auxiliary emitter is conductively connected to the auxiliary emitter via a semiconductor switch. The area of employment comprises trigger-sensitive thyristors with high di/dt and dU/dt stability.

13 Claims, 5 Drawing Figures

FET CONTROLLED THYRISTOR

CROSS REFERENCE TO RELATED APPLICATION

This application is related to my co-pending application Ser. No. 345,594, filed Feb. 4, 1982.

BACKGROUND OF THE INVENTION

1. Field of the Invention

The present invention relates to a thyristor having internal current gain wherein the thyristor comprises an n-emitter which carries a cathode, a p-emitter which carries an anode, and two base layers therebetween and respectively adjacent thereto, and to a method for operation of the thyristor.

2. Description of the Prior Art

A thyristor of the general type set forth above is known from the "Thyristor Handbook" by A. Hoffmann and K. Stokker, Verlag Siemens AG, Berlin and Munich, 1965, pp. 27–28. An interstitial auxiliary emitter is provided and is permeated by a current when the thyristor is triggered, which effects a rapid and large-surface ignition in the area of the principal emitter. Because of the rapid sequence of the entire trigger operation, a thyristor of this type is suitable for rapid rises of the load current flowing between the anode and cathode, i.e. it exhibits a high di/dt stability.

A thyristor having internal current gain is disclosed in the German patent application No. P 29 45 347.2 in which the principal emitter comprises a plurality of fixed emitter short circuits, whereas the auxiliary emitter is provided with emitter short circuits which can be optionally switched on by field effect transistor (FET) structures, i.e. are controllable. When it is switched on, then the thyristor exhibits good stability, i.e. high protection against unintentional trigger operations given the occurrence of voltages poled in the forward conducting direction which, under certain conditions, can rise very quickly, i.e. represent a high dU/dt load. On the other hand, the thyristor is trigger-insensitive given short circuits which are switched off.

SUMMARY OF THE INVENTION

The object of the present invention is to provide a thyristor of the type generally set forth above which, despite a simple structure, largely meets the mutually contradictory requirements for good stability and a high trigger sensitivity.

According to the present invention, the above object is achieved in a thyristor having a semiconductor body which contains an n-emitter carrying a cathode, a p-emitter carrying an anode, and two base layers therebetween and respectively adjacent thereto and which exhibits an auxiliary emitter serving for internal current gain, in that a connectible auxiliary emitter is provided which is conductively connectible to the first-mentioned auxiliary emitter via a semiconductor switch, and in that the connectible auxiliary emitter forms a npn or pnp structure together with the two bases whose current transfer ratio $\alpha_{npn1}$ existing in the conductive state of the semiconductor switch and given application of a blocking voltage is greater relative to the charge carriers emitted by the connectible auxiliary emitter than is the corresponding current transfer ratio $\alpha_{npn2}$ of the npn or pnp structure which is formed of the first-mentioned auxiliary emitter and the two bases.

The advantage which may be obtained in practicing the present invention, in particular, is that the connectible auxiliary emitter is inoperative, on the one hand, in the nonconductive state of the semiconductor switch and does not reduce the stability of the thyristor, whereas, on the other hand, it significantly increases the trigger sensitivity of the thyristor in the conductive state of the semiconductor switch. In detail, the trigger sensitivity rises to the same degree to which the current transfer ratio of the structure which comprises the connectible auxiliary emitter and the two bases is greater with respect to the charge carriers emitted by the connectible auxiliary emitter than is the corresponding current transfer ratio of the structure which comprises the first-mentioned auxiliary emitter and the two bases.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
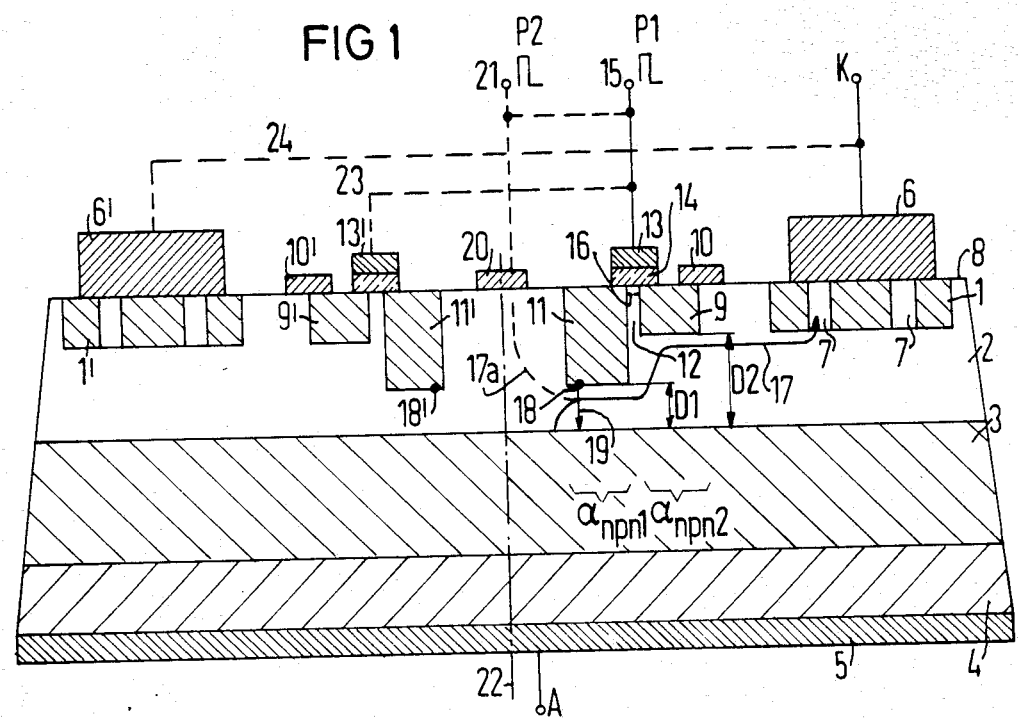
FIG. 1 is a sectional view through a first exemplary embodiment of a thyristor constructed in accordance with the present invention.

A thyristor is illustrated in FIG. 1 which comprises a semiconductor body having four layers of alternating conductivity type comprising a doped semiconductor material, for example, silicon. An n-conductive layer 1 is designated as an n-emitter, a p-conductive layer 2 is designated as a p-base, an n-conductive layer 3 is designated as an n-base and a p-conductive layer 4 is designated as a p-emitter. The p-emitter 4 is provided with an anode 5 which has a terminal A, whereas the n-emitter 1 is provided with a cathode 6 having a terminal K.

The n-emitter 1, which represents the principal emitter, is penetrated by a plurality of projections 7 of the p-base 2 which extend up to the boundary surface 8 of the semiconductor body and are conductively connected to the cathode 6 at the boundary surface 8. The projections 7 represent fixed emitter short circuits which largely prevent an unintentional triggering of the thyristor given application of a blocking voltage to the terminals A and K which places the anode 5 at a more positive potential than the cathode 6. This can be explained by the fact that the hole carriers transported in the direction toward the end-emitter 1 under the influence of the blocking voltage do not, for the majority, arrive at the pn junction between the elements 1 and 2 but, rather, arrive directly to the cathode 6 via the projections 7, so that they do not trigger an emission of carriers from the n-emitter 1. Given an increasing plurality of fixed emitter short circuits 7, the thyristor is also insensitive to triggering with respect to larger or rapidly rising blocking voltages at the terminals A, K, i.e. it is stable.

An n-conductor region 9, which represents a first auxiliary emitter, is provided in the p-base 2 in such a manner that it extends up to the boundary surface 8. At the boundary surface 8, the first auxiliary emitter is contacted by an auxiliary emitter electrode 10 which conductively bridges the pn junction between the region 9 and the p-base 2 in the direction toward the n-emitter 1.

Proceeding from the boundary surface 8, a further n-conductive region 11 extends significantly deeper into the p-base 2 than do the n-emitter 1 and the first auxiliary emitter 9 and is generated by diffusion or ion implantation and subsequent homing-in of donors into the p-base 2. The region 11 is disposed laterally adjacent the first auxiliary emitter 9, whereby it has a distance to the first auxiliary emitter 9 which is determined by the width of a region 12 of the p-base 2. The region 12 is covered by a gate 13 which is metallic or consists of polysilicon and which is separated from the boundary surface 8 by a thin, electrically insulating layer 14 consisting, for example, of $SiO_2$. The gate 13 is connected to a control voltage terminal 15. The mutually facing edge regions of the first auxiliary emitter 9 and of the region 11, a second auxiliary emitter, together with the region 12, the insulating layer 14 and the gate 13 form a field effect transistor of the enhancement type. Given application of a control voltage to the terminal 15 which is positive in comparison to the potential at the terminal K and exceeds the value of the threshold voltage, an inversion channel 16 is formed at the boundary surface 8 below the gate 13. This n-conductive channel represents a low-resistance connection between the first auxiliary emitter 9 and the second auxiliary emitter 11. When the control voltage is disconnected from the terminal 15, the channel 16 is eliminated and the connection between the regions 9 and 11 is interrupted. The structure formed of the elements 9-16, therefore, represents a semiconductor switch which in its first switching state connects the second auxiliary emitter 11 to the first auxiliary emitter 9 in a low-resistance manner, so that an increased auxiliary emitter 9, 11 arises, whereas, in its second switching state it separates the second auxiliary emitter 11 from the first auxiliary emitter 9, so that the second auxiliary emitter 11 cannot exert any auxiliary emitter function. In the following, the region 11, referred to as the second auxiliary emitter, will also be referred to as a connectible, second auxiliary emitter.

Proceeding from the boundary surface 8, the penetration depth of the connectible, second auxiliary emitter 11 into the p-base 2 amounts to more than twice the penetration depth of the auxiliary emitter 9 or, respectively, of the n-emitter 1 in the exemplary embodiment illustrated in FIG. 1. If one assumes a penetration depth of approximately 20 μm for the first auxiliary emitter 9, then the penetration depth of the connectible second auxiliary emitter 11 amounts to, for example, 50 μm. Accordingly, the distance D1 of the connectible second auxiliary emitter 11 from the pn junction between the bases 2 and 3 is smaller than the distance D2 of the first auxiliary emitter 9 or, respectively, the n-emitter 1 from that same junction.

The ignition of the thyristor according to FIG. 1 is set forth below. It is assumed that a voltage poling the thyristor in the forward conducting direction is applied to the terminals A and K and that a positive control voltage is supplied to the terminal 15. Under the influence of the former voltage, thermally-generated hole carriers, for example, more along the path 17 indicated in FIG. 1 in the direction toward a fixed emitter short circuit 7, so that, given the conductive channel 16, a voltage drop arises at the point 18 which biases the pn junction between the connectible second auxiliary emitter 11 and the p-base 2 to such a degree in the forward conducting direction that electrons are emitted into the p-base 2 at this location. The electrons emitted by the connectible second auxiliary emitter 11 move in the direction of the arrow 19, whereby some of the electrons reach the boundary surface between the p-base 3 and the p-emitter 4 and occasion an emission of hole carriers from the p-emitter. These emission operations mutually promote one another until the bases 2 and 3 are flooded by emitted charge carriers, i.e. the thyristor has triggered in the area of the connectible second auxiliary emitter 11. Thereby, the load current flowing from the anode 8 across the auxiliary emitter 9, 11 and the auxiliary emitter electrode 10 to the n-emitter 1 and to the cathode 6 represents a high ignition current for the n-emitter 1.

As soon as the triggered surface of the thyristor has spread in the lateral direction proceeding from the connectible second auxiliary emitter 11 to such a degree that it at least partially co-covers the region of the n-emitter 1, the load current flowing between the anode A and the cathode K is completely accepted by that portion of the thyristor cross-section which contains the triggered portion of the n-emitter 1. The first auxiliary emitter 9 is then no longer traversed by load current. Therefore, a pulse-shaped control voltage P1 can be supplied to the terminal 15 which is switched off when the thyristor cross-section in the area of the n-emitter 1 has become current-conducting.

For the case in which an ignition electrode 20 is disposed on the p-base 2, the ignition of the thyristor occurs at smaller voltages between the anode A and the cathode K then was assumed above, ignition occurring by the application of an ignition current pulse P2 which is supplied via an ignition circuit connected at a terminal 21. The bias voltage at the circuit point 18 is thereby generated by hole carriers which derive from the semiconductor region below the ignition electrode 20 and which, via the paths 17a and 17 indicated in FIG. 1, arrive at a fixed short circuit 7. Thereby, the terminal 15 is connected simultaneously with the control voltage P1. Expediently, the terminals 15 and 21 are connected to one another, whereby the ignition current pulse P2 at the terminal 15 allows the voltage pulse P1 to drop off.

The thyristor is quenched when the load current falls below a holding current. This occurs, for example, when the voltage is disconnected from the terminals A and K or, if it is a matter of alternating voltage, upon occurrence of the next successive zero crossing.

The great trigger sensitivity of the thyristor according to FIG. 1 derives from the small distance d1 between the connectible second auxiliary emitter 11 and the boundary surface between the bases 2 and 3. The current transfer ratio $\alpha_{npn1}$ of the npn structure formed of the elements 11, 2 and 3 which relates to the electrons emitted by the connectible second auxiliary emitter 11 is significantly greater than the current transfer ratio $\alpha_{npn2}$ for the npn structure formed of the elements 9, 2 and 3. This is explained by the fact that the recombination rate of the electrons emitted by the first auxiliary emitter 9 is significantly greater because of the greater distance D2 of the first auxiliary emitter 9 from the boundary surface between the bases 2 and 3 than is the recombination rate of the electrons emitted by the connectible second auxiliary emitter 11. The trigger sensitivity of the thyristor according to FIG. 1, therefore, is greater than the trigger sensitivity of a conventional thyristor having internal trigger gain by the same degree by which the current transfer ratio $\alpha_{npn1}$ is greater than $\alpha_{npn2}$.

When the p-base 2 exhibits a doping profile in which the doping degree in the area of the lower boundary surface of the connectible second auxiliary emitter 11 is smaller than at the lower boundary surface of the first auxiliary emitter 9, then the bias voltage of the pn junction between the connectible second auxiliary emitter 11 and the base 2 prevailing at the point 18 is further increased in comparison to that case in which the doping degree of the p-base does not exhibit such a reduction, so that the trigger sensitivity in the area of the connectible second auxiliary emitter 11 increases further.

For reasons of greater clarity, the principle of the invention has, up to this point, been explained on the basis of that portion of the illustrated thyristor lying to the right of the vertical center line 22. If one proceeds from a rotational-symmetrical format of the thyristor of FIG. 1 with the line 22 as the axis of symmetry, then annular embodiments of the elements 1, 9, 11, 6, 10 and 13 derive. The section planes of these elements which lie to the left of the center line 22 are referenced with 1', 9', 11', 6', 10 and 13'. The ignition of such a structure occurs along a circle containing the points 18 and 18' and lies concentric to the axis 22.

On the other hand, the line 22 of FIG. 1 can also be interpreted as a plane of symmetry which is perpendicular to the plane of the drawing. Thereby, the elements 1, 9, 11, 6, 10 and 13 advantageously exhibit an elongate form and their greater dimensions extend perpendicularly to the plane of the drawing, namely, preferably over the entire thyristor cross-section. The elements 1', 9', 11', 6', 10' and 13' then represent analogous substructures at the other side of the plane of symmetry which lie symmetrically with respect to the elements 1, 9, 11, 6, 10 and 13 relative to the latter. The gates 13 and 13' in this case are connected to one another for the purpose of a common drive, this being indicated by a broken line 23, and they can be connected to the terminal 21. The cathode 6' is connected to the cathode 6, this also being indicated by the broken line 24.

The element 1, 9, 11, 6, 10 and 13 can also be advantageously designed strip-like and cover the thyristor cross-section or portions thereof in the form of a spiral or the like.

Figure 2:
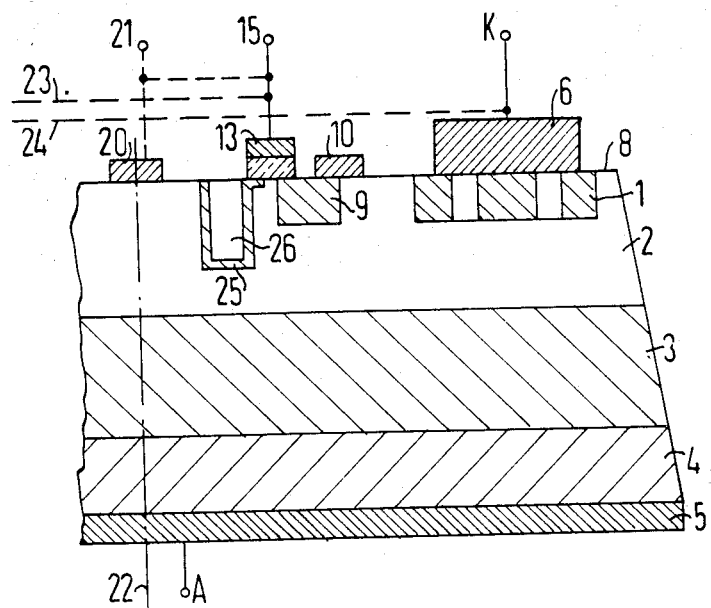
FIG. 2 is a fragmentary sectional view through a thyristor constructed in accordance with the second exemplary embodiment of the invention.

Given the exemplary embodiment illustrated in FIG. 2, a connectible second auxiliary emitter 25 is provided which replaces the connectible second auxiliary emitter 11 of FIG. 1 and exhibits the same external dimensions relative to the p-base 2 as does the connectible second auxiliary emitter 11. A trench-like recess 26 in the p-base 2 is provided at the edge zones, whereby, proceeding from the edge of the p-base 2, it extends only a few $\mu$m, for example, 5 $\mu$m, deep into the p-base 2. The n-conductive region 25 is generated by diffusion or implantation of donors, whereas the recess 26 is preferably manufactured by etching. The remaining circuit elements of FIG. 2 correspond to the circuit elements of FIG. 1 which bear the same reference characters.

Figure 3:
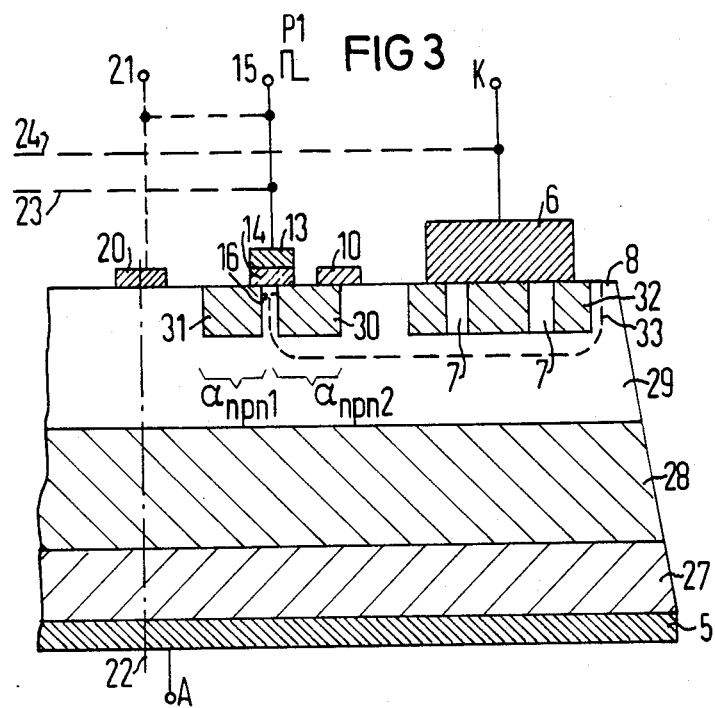
FIG. 3 is a fragmentary sectional view through a thyristor constructed in accordance with a third exemplary embodiment of the invention.

In FIG. 3, a thyristor is illustrated which comprises a p-emitter 1, an n-base 28, a p-base 29 and an n-emitter 32. A first auxiliary emitter 30 and a connectible second auxiliary emitter 31 replace the elements 9 and 11 of FIG. 1 and exhibit the same lateral dimensions relative to the p-base 29 as do the elements 9 and 11 relative to the p-base 2. The n-emitter 32 takes the place of the n-emitter 1 of FIG. 1 and exhibits the same lateral dimensions as that element. The vertical dimensions of the elements 30–32 are matched to one another, whereby they are advantageously greater than the vertical dimensions of the n-emitter 1 and, for example, correspond to those of the elements 11 and 11' of FIG. 1. The remaining circuit elements of FIG. 3 correspond to the circuit elements of FIG. 1 and have been provided with the same reference characters.

The n-emitter 32 and the first auxiliary emitter 30 are surrounded by a sub-region 33 of the p-base 29 which exhibits an additional p doping, so that its degree of doping is higher than the remaining sub-regions of the p-base 29. This results in the fact that the three layer structure comprising the elements 30, 29 and 28 exhibits a current transfer ratio $\alpha_{npn2}$ relative to the electrons emitted by the first auxiliary emitter 30 in case the voltage is applied at the anode A and the cathode K in the forward conducting direction of the thyristor which is smaller than the corresponding current transfer ratio $\alpha_{npn1}$ of the three layer structure 31, 29 and 28 relative to the electrodes emitted by the connectible second auxiliary emitter 31. The ratios $\alpha_{npn1}$ and $\alpha_{npn2}$ differ all the more greatly from one another the more greatly the doping degree of the sub-region 33 differs from that of the remaining sub-regions of the p-base 29. When a control voltage, for example the voltage P1, is supplied to the terminal 15 which effects conductive connection of the auxiliary electrodes 30 and 31 in a low resistance manner by way of an inversion channel 16, then the thyristor becomes very trigger sensitive in the area of the connectible second auxiliary emitter 31. When the control voltage is disconnected from the terminal 15, the connectible second auxiliary emitter 31 is inoperative, so that the thyristor exhibits great stability because of the fixed emitter short circuits 7 and the high doping of the sub-region 33. Given an impurity concentration in the p-base 29 of approximately $5 \times 10^{16}$ cm$^{-3}$, an impurity concentration of approximately $2 \times 10^{17}$ cm$^{-3}$ comes into consideration, for example, for the sub-region 33, whereby these numerical indications only serve the purpose of explaining the doping difference and are not to be interpreted as limiting values.

Different current transfer ratios $\alpha_{npn1}$ and $\alpha_{npn2}$ can also be achieved in such a manner that the sub-region 33 is not more strongly doped than the remaining portions of the p-emitter 29, but that it is provided with additional recombination centers instead. This occurs, for example, by radiation of the p-base 29 which is limited to the sub-region 33 before the regions 32 and 30 are generated, with an electron beam. On the other hand, recombination centers in the form of gold or platinum atoms can also be incorporated into the sub-region 33 by diffusion or implantation. The increase in the plurality of recombination centers in the sub-region 33 effects a reduction of the ratio $\alpha_{npn2}$ in comparison to the ratio $\alpha_{npn1}$.

The thyristors according to FIGS. 2 and 3 are operated in the same manner as the thyristor according to FIG. 1.

Figure 4:
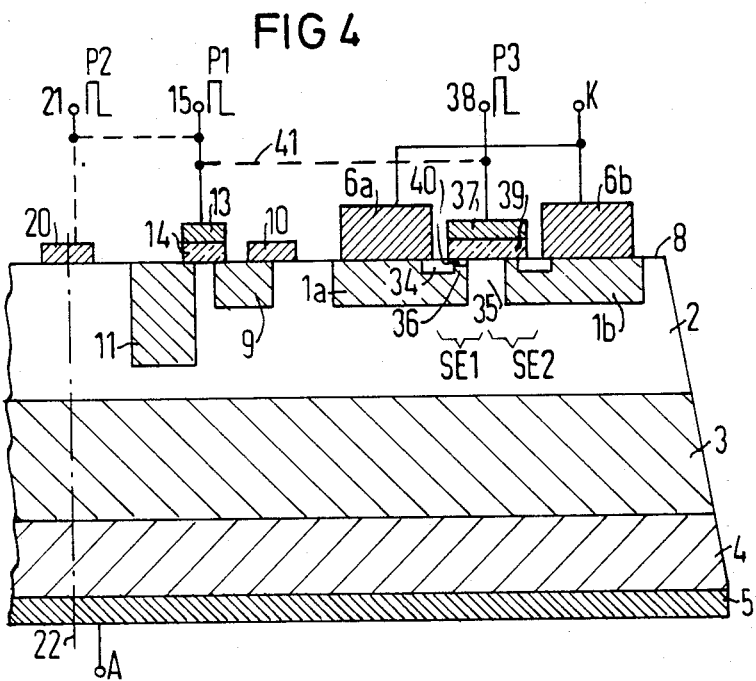
FIG. 4 is a fragmentary sectional view through a thyristor constructed in accordance with a fourth embodiment of the invention.

The exemplary embodiment illustrated in FIG. 4 differs from that of FIG. 1 in that, instead of the fixed emitter short circuit 7, controllable emitter short circuits are provided. The n-emitter 1 of FIG. 1 is divided into two or more emitter sub-regions 1a, 1b of which each is provided with an element 6a or, respectively, 6b, of the cathode. The elements 6a and 6b are connected to one another and are connected to a common terminal K.

A controllable emitter short circuit SE1 in FIG. 4 comprises a p-conductive semiconductor region 34 within the emitter sub-region 1a, the p-conductive semiconductor region 34 extending up to the boundary surface 8 of the semiconductor body and being contacted by the element 6a of the cathode at the boundary surface 8. The emitter sub-regions 1a and 1b are separated from one another by a region 35 of the p-base 2, which is to be interpreted as being a second p-conductive semiconductor region of the controllable emitter short circuit. An edge region 36 of the emitter sub-region 1a lies between the regions 34 and 35. The emitter sub-region 1a is covered by a gate 37 which is provided with a terminal 38 and is separated from the semiconductor body by a thin, electrically insulating layer 39 comprising, for example, $SiO_2$. The elements 34–37 form a FET structure of the depletion type in which, without supplying a control voltage to the terminal 38, a p-conductive channel 40 exists in the edge region 36 and connects the region 34 to the region 35 and, therefore, connects the cathode element 6a to the p-base 2 in a low-resistance manner. The channel 40 is either an inversion channel or is a doped channel generated by a p-doping at the boundary surface 8. Therefore, the emitter short circuit SE1 is switched on given a voltage-free terminal 38. When a positive control voltage is supplied to the terminal 38, then the channel 40 is eliminated and the low-resistance connection of the p-base 2 and the cathode element 6a is interrupted, i.e. the emitter short circuit SE1 is suppressed.

A further controllable emitter short circuit SE2 is constructed in accordance with the short circuit SE1 and is provided at the edge side relative to the emitter element 1b in FIG. 4. Thereby, the gate 37 is mutually assigned to the emitter short circuits SE1 and SE2. Advantageously, the terminals 38 and 15 may be connected together, as indicated by the broken line 41. The terminals 15 and 38 can also be individually or mutually connected to the terminal 21, as also indicated by a broken line. The remaining circuit elements of FIG. 4 correspond to the elements of FIG. 1 and have been provided with the same reference characters.

Instead of the two emitter sub-regions 1a and 1b as illustrated, a plurality of correspondingly-designed emitter sub-regions, or even only one such sub-region, for example, 1a or 1b can be provided given the exemplary embodiment of FIG. 4.

A particularly high stability is achieved with the exemplary embodiment according to FIG. 4, namely, particularly when a larger plurality of emitter sub-regions 1a, 1b . . . etc and a correspondingly great plurality of controllable emitter short circuits SE1, SE2 . . . etc, are provided. These are suppressed by a positive control voltage, for example, the pulse-shaped control voltage P3, which is applied to the terminal 38 at the time of ignition, so that the propagation of the triggered front over the entire thyristor cross-section is not impeded by the emitter short circuits. When the thyristor cross-section has become conductive in the area of the emitter sub-regions 1a, 1b, the control voltage can be turned off, as is indicated by the trailing edge of the pulse P3. When a terminal 21 is provided to which an ignition current pulse P2 is supplied, then the terminal 38 can be connected to the terminal 21 in order to be able to employ the voltage at the terminal 21 as the control voltage. P3. The control of the terminal 15 occurs in the manner already set forth above with respect to FIG. 1.

The FET structures, for example, the elements 34–40, of the depletion type described above can also be replaced by FET structures of the enhancement type when their gate terminals, for example, 38, have an additional negative control voltage supplied thereto which permits the inversion channels, for example, the channel 40, to arise. The control voltage P3 is then superimposed on this additional control voltage at the time of ignition in order to eliminate the channels.

Figure 5:
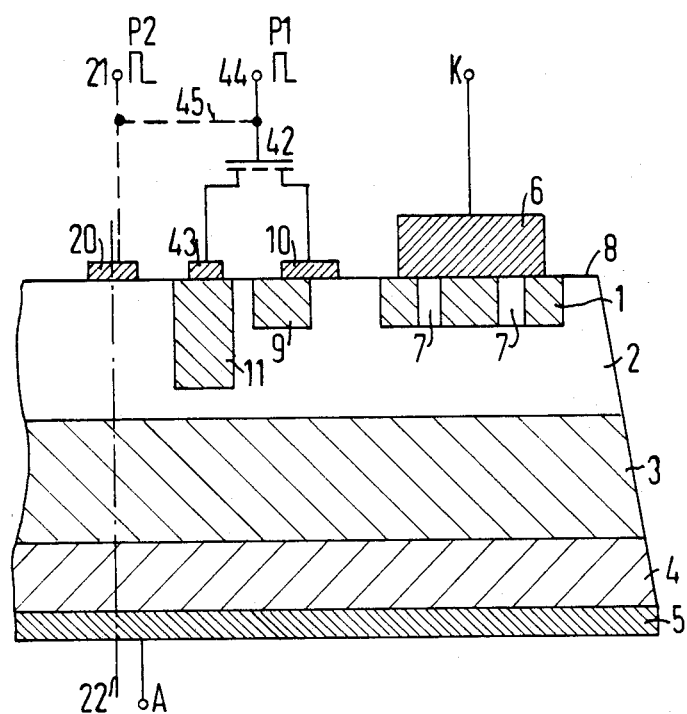
FIG. 5 is a schematic representation of an alternative embodiment to that of FIG. 1.

FIG. 5 illustrates another construction of the exemplary embodiment according to FIG. 1 in which the connectible second auxiliary emitter 11 is connected to the first auxiliary emitter 9 via a semiconductor switch in the form of an external field effect transistor 42. The source-drain path of the transistor 42 is connected, on the one hand, to the emitter electrode 10 of the first auxiliary emitter 9 and, on the other hand, to a conductive layer 43 which contacts the connectible second auxiliary emitter 11. The gate of the transistor 42 is provided with a control voltage terminal 44 which can be connected to the terminal 21 as indicated by the broken line 45. The operation of the thyristor according to FIG. 5 occurs in the manner described on the basis of FIG. 1, whereby the terminal 44 corresponds to the terminal 15 and is provided with the control voltage P1, whereas an ignition current pulse P2 is supplied under certain conditions to the terminal 21. Within the scope of the invention, the connectible second auxiliary emitter can also be P-conductive, can be laterally disposed adjacent the p-emitter in the n-base of the transistor, and can be connected in a low resistance manner to the p-emitter via a semiconductor switch in order to produce a high trigger sensitivity. In this case, the fixed or controllable emitter short circuits are also disposed in the area of the p-emitter. All figures can be employed for the illustration of this circuit alternative when the designations of the terminals A and K are interchanged, the semiconductor elements respectively receive conductivity types which are opposite to those previously described, and the control voltages as well as the control current are supplied with opposite polarity.

All exemplary embodiments according to FIGS. 2–5 can be designed centrally symmetrical respectively relative to an axis of symmetry 22 according to FIG. 1 or can be respectively symmetrically constructed relative to a plane which is perpendicular to the plane of the drawing and is indicated by the line 22.

The exemplary embodiments of FIGS. 2, 3 and 4 can also be equipped with a semiconductor switch in the form of an external transistor. Further, the connectible second auxiliary emitter 11 of the structures of FIGS. 4 and 5 can be designed in accordance with the elements 25, 26 of FIG. 2 and the fixed emitter short circuits 7 in all embodiments can be replaced by controllable emitter short circuits, for example, SE1 or SE2.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a thyristor of the type having a semiconductor body comprising a first base of a first conductivity type contacting a second base of a second conductivity type, a first emitter of the second conductivity type on the first base carrying a first electrode at a boundary surface of the semiconductor body, a second emitter of the first conductivity type carried on the second base, and, for internal current gain, an auxiliary emitter of the second conductivity type spaced laterally from the first emitter and extending from the boundary surface into the first base toward the pn junction of the first and second bases, the auxiliary emitter being a first auxiliary emitter and forming a first semiconductor structure, together with the first and second bases, which has a current transfer ratio $\alpha_2$, the improvement therein comprising:

a second auxiliary emitter extending into the first base from the boundary surface, spaced from the first auxiliary emitter, and forming a second semiconductor structure, together with the first and second bases, having a current transfer ratio $\alpha_1$; and a semiconductor switch operable to selectively connect and disconnect the first and second auxiliary emitters, the current transfer ratio $\alpha_1$ of the second semiconductor structure, with the application of a blocking voltage to the thyristor, being greater than the current transfer ratio $\alpha_2$ of the first semiconductor structure in the conductive state of said semi-conductor switch, relative to the charge carriers emitted by said second auxiliary emitter due to the recombination rate of the first auxiliary emitter being significantly greater than that of the second auxiliary emitter because of the greater distance of the first auxiliary emitter to the pn junction of the first and second bases.

2. The improved thyristor of claim 1, wherein: the first base is a p-base.

3. The improved thyristor of claim 1, wherein: said first base is an n-base.

4. The improved thyristor of claim 1, wherein: the distance between the second auxiliary emitter and the pn junction of the two bases is less than the distance of the first auxiliary emitter from that pn junction.

5. The improved thyristor of claim 1, wherein: said first base includes a region surrounding the first auxiliary emitter which is doped higher than the remainder of the first base.

6. The improved thyristor of claim 1, wherein:
said first base includes a first sub-region surrounding the first auxiliary emitter and a second sub-region surrounding the second auxiliary emitter, and said first and second sub-regions including a plurality of recombination regions, greater in number in the first sub-region than in the second sub-region.

7. The improved thyristor of claim 1, wherein said semiconductor switch comprises:

a first edge region of the second auxiliary emitter;

a second edge region of the first auxiliary emitter;

an interim region of the first base between and separating the first and second edge regions; and an insulated gate covering the interim region and adapted to receive a control voltage.

8. The improved thyristor of claim 1, wherein;
said semiconductor switch comprises an external field effect transistor including a source-drain path connected to the first and second auxiliary emitters and a gate adapted to receive a control voltage.

9. The improved thyristor of claim 1, and further comprising:

a recess in the semiconductor body in the first base extending inwardly from the boundary surface;

semiconductor material as the second auxiliary emitter about the recess; and a control electrode on the boundary surface bridging the first and second auxiliary emitter.

10. The improved thyristor of claim 1, and further comprising:

a controllable emitter short circuit for the first emitter, comprising a region of the first base adjacent an edge region of the first emitter, a further region of the first conductivity type in the first emitter adjacent the edge region thereof, and an insulated gate bridging said region of the first base and the further region and having a terminal for receiving a control voltage.

11. The improved thyristor of claim 1, and further comprising:

an ignition electrode on the first base; and a terminal connected to said ignition electrode for connection to an ignition circuit.

12. The improved thyristor of claim 10, and further comprising:

an ignition electrode on the first base; and a terminal connected to said ignition electrode for connection to an ignition circuit.

13. The improved thyristor of claim 1, and further comprising:

an anode carried on the second emitter; and a cathode carried on the first emitter.

* * * * *